United States Patent Office 2,827,367

Patented Mar. 18, 1958

2,827,367

ETCHING OF SEMICONDUCTOR MATERIALS

Douglas L. Cox, Irving, Tex., assignor to Texas Instruments Incorporated, Dallas, Tex., a corporation of Delaware No Drawing. Application August 30, 1955
Serial No. 531,619

4 Claims. (Cl. 41—42)

This invention relates to the etching of semiconductor materials in the course of preparing them for use in electrical semiconductor devices and to an etching solution particularly adapted to that use.

The art of electrical semiconductor devices has advanced with extreme rapidity in the last few years and many new techniques have been invented and adopted for the purpose of expediting the manufacture of transistors, semiconductor diodes and other electrical semiconductor devices. Almost all of these devices utilize very small blocks or bars of semiconductor materials with two or more electrical connections affixed to them. Not only must these connections be made, but in most cases they must be located very accurately on the surface of the semiconductor material if the finished device is to have the desired electrical characteristics.

The position at which the connection is to be made is quite often not ascertainable by a mere measurement, but must be established by a careful examination of the semiconductor segment itself to determine exactly where on the surface of the semiconductor material the transition from one type of conductivity material to another type of conductivity material takes place. This is commonly done by etching the surface of the semiconductor material and then locating the places where the connection is to be made, by examination of the surface of the semiconductor material under a microscope. The size of the semiconductor segment to which the connection is to be made is usually very small. For example, the segment may be a bar about .040 inch in cross-section and .250 inch in length.

Prior to this invention, semiconductor elements of the general order of size mentioned above were prepared by cutting them from a larger segment and either using a cutting instrument such as a cavitron or a fine diamond-toothed saw which would leave their surfaces quite smooth, or polishing the surfaces to bring them to a fair state of smoothness. Thereafter, these small segments were etched with an etching solution generally known as "CP–4," which consists of hydrofluoric acid, nitric acid, acetic acid and a small amount of bromine. Following this etching, the segments were washed to remove the etching solution, dried, and placed under a jeweler's lens or microscope, where they could be observed closely while a contact was fixed thereto, in a position determined by sight. The actual attaching of the contact was accomplished either by passing an electric current through the wire which was to form the contact and through the semiconductor section or by applying heat externally.

In accordance with this invention, it has been discovered that the same general process may be accomplished much more expediently by the use of a different etching solution, this solution being composed of nitric acid, hydrofluoric acid and potassium iodide. The improved etching solution is far more stable than the one previously used, etches somewhat faster and without pitting the surface, and leaves the surface in such a condition that it is much easier for the observer to locate the junction between material of two different types of conductivity.

According to the preferred example for etching germanium, the etching solution of this invention consists of 300 ml. of concentrated nitric acid, 180 ml. of 48% hydrofluoric acid, and 120 drops of 1% potassium iodide solution in distilled water. A variation of about ±20 ml. of hydrofluoric acid is well within the scope of this invention, and a variation of potassium iodide solution of from about 50 drops to about 200 drops is within the scope of this invention. A change in the amount of potassium iodide tends to change the speed of etching; the more potassium iodide present, the faster the etching.

In etching silicon, it has been found preferably to increase the proportion of hydrofluoric acid to 200 ml. ±20 ml. and also to increase the amount of potassium iodide solution to between 150 and 200 drops. The etching solution of this invention works well at room temperature, but may be used at temperatures somewhat above or somewhat below room temperature without losing the effect and advantages of this invention.

It will immediately be apparent that a lesser amount of more concentrated hydrofluoric acid may replace the amounts of 48% of hydrofluoric acid specified and that, similarly, a lesser amount of more concentrated potassium iodide solution may replace that specified. However, in such a case, it will be found desirable to add a sufficient amount of distilled water to bring the total concentrations in line with those that will result from a mixing of the reagents specified in the concentrations and proportions specified.

As one specific example of the practice of the method of this invention, germanium transistor bars approximately 0.40 inch square and .250 inch long, and having a transverse layer of p-type conductivity material sandwiched between two ends which are of n-type conductivity, may be cut from a larger grown junction crystal by a diamond-toothed saw.

These transistor bars, the surfaces of which are relatively quite smooth by reason of the way in which they are prepared, may be subjected to a solution consisting of 300 ml. of concentrated nitric acid, 180 ml. of 48% hydrofluoric acid, and 120 drops of 1% potassium iodide solution in distilled water. This may be done at room temperature for a period of from 10 to 60 seconds. During that time, the transistor bars should be stirred or moved at rather frequent intervals in the etching solution in order that even etching be achieved. Preferably, they are tumbled continuously during the etching.

At the end of this etching operation, the bars may be washed in distilled water and dried, and then taken separately and held in position under a microscope while an electrical connection is affixed to the p-layer of each transistor bar. This may be accomplished by passing an electrical current through the connecting wire and the transistor bar so that fusion takes place at the point of contact.

Contacts are then affixed to the ends of the bars in the usual way, and the transistor completed by mounting and covering.

As an example of the process of this invention as applied to silicon, a silicon transistor bar of the same size and characteristics as the germanium bar may be subjected to exactly the same treatment, except that the etching solution consists of 300 ml. of concentrated nitric acid, 200 ml. of 48% hydrofluoric acid and 200 drops of 1% potassium iodide in distilled water.

What is claimed is:

1. A method of etching electrical semiconductors that comprises treating the surface of the semiconductor with an etching solution containing nitric acid, hydrofluoric acid and potassium iodide in the proportions of 300 ml.

of concentrated nitric acid, to approximately 160 to 220 ml. of 48% hydrofluoric acid, to approximately 50 to 200 drops of 1% potassium iodide solution in distilled water.

2. A method as defined in claim 1 in which the semiconductor material is germanium.

3. A method as defined in claim 1 in which the semiconductor material is silicon.

4. An etching solution for semiconductors comprising nitric acid, hydrofluoric acid and potassium iodide in the proportions of 300 ml. of concentrated nitric acid, to approximately 160 to 220 ml. of 48% hydrofluoric acid, to approximately 50 to 200 drops of 1% potassium iodide solution in distilled water.

References Cited in the file of this patent

UNITED STATES PATENTS

| | | |
|---|---|---|
| 2,705,192 | Faust et al. | Mar. 29, 1955 |
| 2,708,184 | Hager | May 10, 1955 |

U. S. DEPARTMENT OF COMMERCE

PATENT OFFICE

CERTIFICATE OF CORRECTION

Patent No. 2,827,367 Douglas L. Cox March 18, 1958

It is hereby certified that error appears in the printed specification of the above numbered patent requiring correction and that the said Letters Patent should read as corrected below.

Column 2, line 34, for "0.40" read -- .040 --.

Signed and sealed this 27th day of May 1958.

(SEAL)

Attest:

KARL H. AXLINE

Attesting Officer

ROBERT C. WATSON
Commissioner of Patents